United States Patent
Nah et al.

(10) Patent No.: US 8,304,879 B2
(45) Date of Patent: Nov. 6, 2012

(54) SPIRAL STAIRCASE SHAPED STACKED SEMICONDUCTOR PACKAGE AND METHOD FOR MANUFACTURING THE SAME

(75) Inventors: Da Un Nah, Seoul (KR); Jae Myun Kim, Gyeonggi-do (KR); Tae Hoon Kim, Gyeonggi-do (KR); Jung Tae Jeong, Gyeonggi-do (KR); Bok Gyu Min, Gyeonggi-do (KR); Ki Bum Kim, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 172 days.

(21) Appl. No.: 12/819,279

(22) Filed: Jun. 21, 2010

(65) Prior Publication Data
US 2011/0108995 A1      May 12, 2011

(30) Foreign Application Priority Data
Nov. 9, 2009    (KR) .................. 10-2009-0107588

(51) Int. Cl.
*H01L 23/482*     (2006.01)
(52) U.S. Cl. .. 257/686; 257/777; 257/786; 257/E23.174
(58) Field of Classification Search ............ 257/E23.175
See application file for complete search history.

(56) References Cited

U.S. PATENT DOCUMENTS

| | | | |
|---|---|---|---|
| 6,538,333 B2 * | 3/2003 | Kong ............................ | 257/777 |
| 7,989,940 B2 * | 8/2011 | Haba et al. .................... | 257/686 |
| 7,989,943 B2 * | 8/2011 | Kim et al. ..................... | 257/686 |
| 2007/0194427 A1 * | 8/2007 | Choi et al. ..................... | 257/686 |
| 2007/0290316 A1 * | 12/2007 | Gibson et al. ................. | 257/686 |
| 2009/0065948 A1 * | 3/2009 | Wang ............................. | 257/777 |
| 2009/0121336 A1 * | 5/2009 | Kim ............................... | 257/686 |
| 2010/0007001 A1 * | 1/2010 | Wang et al. .................... | 257/686 |
| 2011/0031591 A1 * | 2/2011 | Min et al. ...................... | 257/618 |

* cited by examiner

*Primary Examiner* — Stephen W Smoot
(74) *Attorney, Agent, or Firm* — Ladas & Parry LLP

(57) ABSTRACT

A spiral staircase shaped stacked semiconductor package is presented. The package includes a semiconductor chip module, a substrate and connection members. The semiconductor chip module includes at least two semiconductor chips which have chip selection pads and through-electrodes. The semiconductor chips are stacked such that the chip selection pads are exposed and the through-electrodes of the stacked semiconductor chips are electrically connected to one another. The substrate has the semiconductor chip module mounted thereto and has connection pads. The connection members electrically connect the chip selection pads to respective connection pads.

14 Claims, 5 Drawing Sheets

SPIRAL STAIRCASE SHAPED STACKED SEMICONDUCTOR PACKAGE AND METHOD FOR MANUFACTURING THE SAME

CROSS-REFERENCE TO RELATED APPLICATIONS

The present application claims priority to Korean patent application number 10-2009-0107588 filed on Nov. 9, 2009, which is incorporated herein by reference in its entirety.

BACKGROUND OF THE INVENTION

The present invention relates to a stack package, and more particularly, to a stack package which allows a certain semiconductor chip to be easily selected among stacked semiconductor chips and a method for manufacturing the same.

These days, semiconductor chips capable of storing and processing huge amounts of data within a relatively short period of time and semiconductor packages having the semiconductor chips is have been developed.

Recently, a stack package, in which a plurality of memory chips are stacked on each other so as to increase data storage capacity, has been developed in a variety of types. In addition, another stack package, in which memory chips and system chips are stacked together so as to not only increase data storage capacity but also improve a data processing speed, has also been developed in a variety of types.

However, in the case of the conventional stack packages, since respective semiconductor chips are stacked in such a way as to completely overlap with one another, it is difficult to select respective semiconductor chips and apply and output data to and from the selected semiconductor chips.

BRIEF SUMMARY OF THE INVENTION

Embodiments of the present invention are directed to a stack package in which the stack structure of through-electrodes and semiconductor chips is changed such that a certain semiconductor chip can be easily selected among stacked semiconductor chips.

Also, embodiments of the present invention are directed to a method for manufacturing the stack package.

In one embodiment of the present invention, a stack package comprises a semiconductor chip module including at least two semiconductor chips which have chip selection pads and is through-electrodes and are stacked such that the chip selection pads are exposed and the through-electrodes are electrically connected with one another; a substrate having the semiconductor chip module mounted thereto and connection pads; and connection members electrically connecting the respective chip selection pads and the respective connection pads with each other.

The respective semiconductor chips may be disposed in a state in which they are sequentially rotated by predetermined angles about centers of the respective semiconductor chips in such a way as to define the shape reminiscent of a spiral staircase so that the chip selection pads of the respective stacked semiconductor chips are exposed.

The chip selection pad may be disposed adjacent to any one corner of four corners when each semiconductor chip has the shape of a quadrangular plate.

The chip selection pads may be disposed adjacent to two corners of four corners which are opposite in a diagonal direction when each semiconductor chip has the shape of a quadrangular plate.

The chip selection pads may be disposed adjacent to two adjoining corners of four corners when each semiconductor chip has the shape of a quadrangular plate.

The through-electrodes may be disposed in a symmetrical matrix shaped pattern on each semiconductor chip.

The through-electrodes may have a shape possessing a sectional area gradually decreasing from one ends thereof, on which the chip selection pads are formed, to the other ends thereof, which face away from the one ends.

The chip selection pad may have a first sectional area, and the through-electrode may have a second sectional area that is greater than the first sectional area.

The respective chip selection pads and the respective connection pads corresponding to the chip selection pads may be separated by the same distance.

The connection members may comprise bonding wires.

The stack package may further comprise additional through-electrodes passing through the chip selection pads; and extensions extending from the connection pads corresponding to the additional through-electrodes to portions facing the additional through-electrodes such that the additional-through electrodes and the connection pads can be electrically connected with each other by the connection members.

The connection members may comprise conductive members which have a spherical shape or a column shape.

In another embodiment of the present invention, a method for manufacturing a stack package comprises the steps of preparing semiconductor chips, each semiconductor chip possessing an upper surface and a lower surface facing away from the upper surface and is having at least one chip selection pad which is disposed adjacent to at least one corner of corners of the semiconductor chip and through-electrodes which pass through the upper surface and the lower surface; forming a semiconductor chip module by stacking at least two semiconductor chips such that chip selection pads of the semiconductor chips are exposed and through-electrodes of the semiconductor chips are electrically connected with each other; and mounting the semiconductor chip module onto a substrate which has connection pads.

The step of mounting the semiconductor chip module onto the substrate may comprise the step of bonding the respective chip selection pads of the respective stacked semiconductor chips and the connection pads of the substrate, corresponding to the chip selection pads, by means of conductive wires.

The step of preparing the semiconductor chips may further comprise the step of forming additional through-electrodes which pass through the chip selection pads; and the step of mounting the semiconductor chip module onto the substrate may comprise the step of electrically connecting the additional through-electrodes with extensions which are formed to extend from the connection pads of the substrate to portions facing the additional through-electrodes, by means of conductive members which has a spherical shape or a column shape.

DESCRIPTION OF SPECIFIC EMBODIMENTS

Hereafter, specific embodiments of the present invention will be described in detail with reference to the accompanying drawings.

It is to be understood herein that the drawings are not necessarily to scale and in some instances proportions may have is been exaggerated in order to more clearly depict certain features of the invention.

Figure 1:
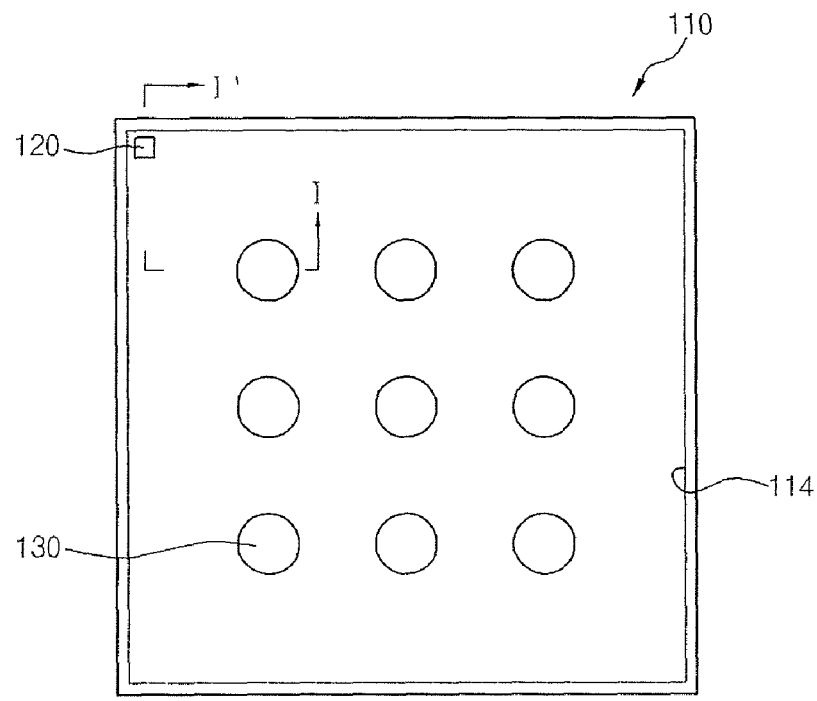
FIG. 1 is a plan view illustrating a semiconductor chip of a stack package in accordance with an embodiment of the present invention.
Figure 2:
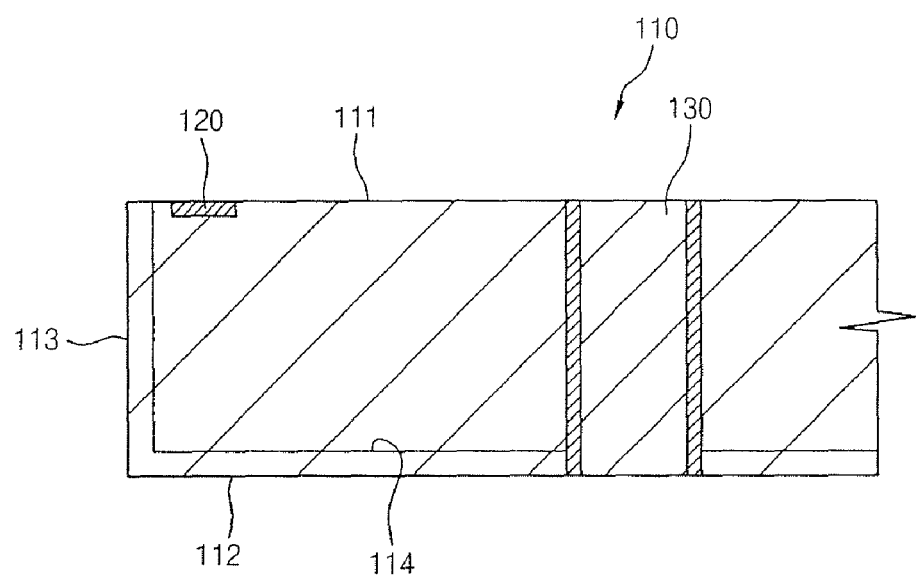
FIG. 2 is a cross-sectional view taken along the line I-I' of FIG. 1.

FIG. 1 is a plan view illustrating a semiconductor chip of a stack package in accordance with an embodiment of the present invention, and FIG. 2 is a cross-sectional view taken along the line I-I' of FIG. 1.

Referring to FIGS. 1 and 2, a semiconductor chip 110 includes a chip selection pad 120 and through-electrodes 130.

The semiconductor chip 110 has, for example, the shape of a quadrangular plate. The semiconductor chip 110 has an upper surface 111, a lower surface 112 which faces away from the upper surface 111, and side surfaces 113. The semiconductor chip 110 having the shape of a quadrangular plate possesses four corners. The semiconductor chip 110 has a circuit unit 114 which includes a data storage section (not shown) for storing data and a data processing section (not shown) for processing data.

The chip selection pad 120 is disposed on the upper surface 111 of the semiconductor chip 110. The chip selection pad 120 is disposed on the upper surface 111 of the semiconductor chip 110 adjacent to any one of the four corners. The chip selection pad 120 is electrically connected with the circuit unit 114. The chip selection pad 120 which is disposed adjacent to the corner on the upper surface 111 of the semiconductor chip 110 has a first sectional area.

The through-electrodes 130 pass through the upper surface 111 and the lower surface 112, facing away from the upper surface 111, of the semiconductor chip 110. In the embodiment, the through-electrodes 130 may have a circular or elliptical cross sectional shape when viewed from above. Unlike this, the through-electrodes 130 may have a curved sectional shape. Examples of materials which can be used to form the through-electrodes 130 include copper, copper alloy, and aluminum.

In the embodiment, one or more through-electrodes 130 can be disposed through the semiconductor chip 110 in the form of a symmetrical matrix shaped pattern. Each through-electrode 130 may have a second sectional area that is greater than the first sectional area of the chip selection pad 120.

While it is illustrated and described in the embodiment that the through-electrodes 130 have a column-like shape, unlike this, the through-electrodes 130 may have a shape which has a sectional area gradually decreasing from one ends thereof to the other ends thereof. For example, the through-electrodes 130 may have the shape of a truncated cone.

Figure 3:
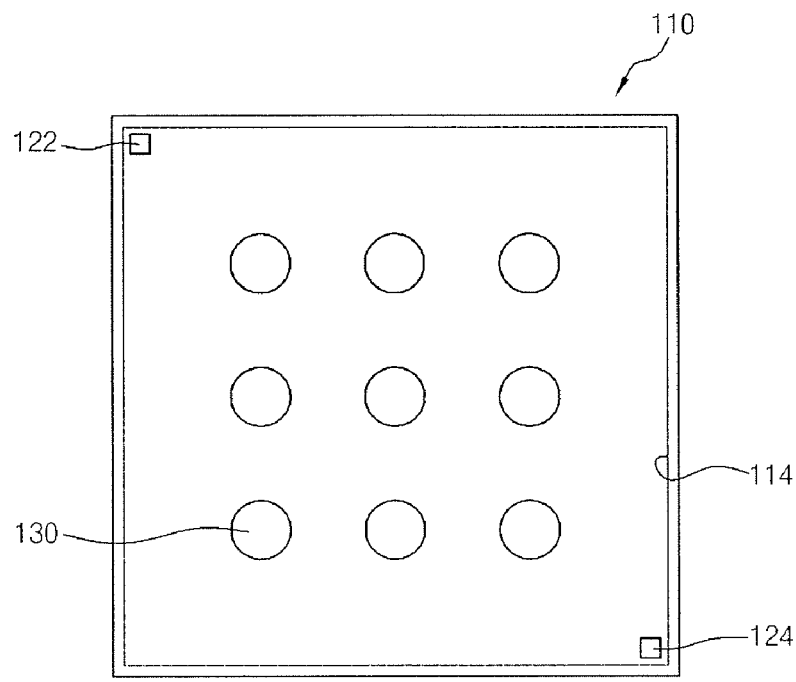
FIG. 3 is a plan view illustrating a semiconductor chip of a stack package in accordance with another embodiment of the present invention.

FIG. 3 is a plan view illustrating a semiconductor chip of a stack package in accordance with another embodiment of the present invention. The semiconductor chip shown in FIG. 3 is substantially the same as the semiconductor chip described above with reference to FIG. 1, except the number and the disposal of chip selection pads. Therefore, repeated description for the same component parts will be omitted herein, and the same technical terms and the same reference numerals will be used to refer to the same component parts.

Referring to FIG. 3, a semiconductor chip 110 includes chip selection pads 122 and 124, and through-electrodes 130.

In the embodiment, the chip selection pads 122 and 124 include a first chip selection pad 122 and a second chip selection pad 124. For example, the first chip selection pad 122 is disposed adjacent to the upper left corner in FIG. 3, and the second chip selection pad 124 is disposed adjacent to the lower right corner in FIG. 3, which is positioned in a diagonal direction with respect to the first chip selection pad 122. Unlike this, it can be envisaged that the first chip selection pad 122 is disposed adjacent to the upper right corner in FIG. 3, and the second chip selection pad 124 is disposed adjacent to the lower left corner in FIG. 3, which is positioned in a diagonal direction with respect to the first chip selection pad 122.

Figure 4:
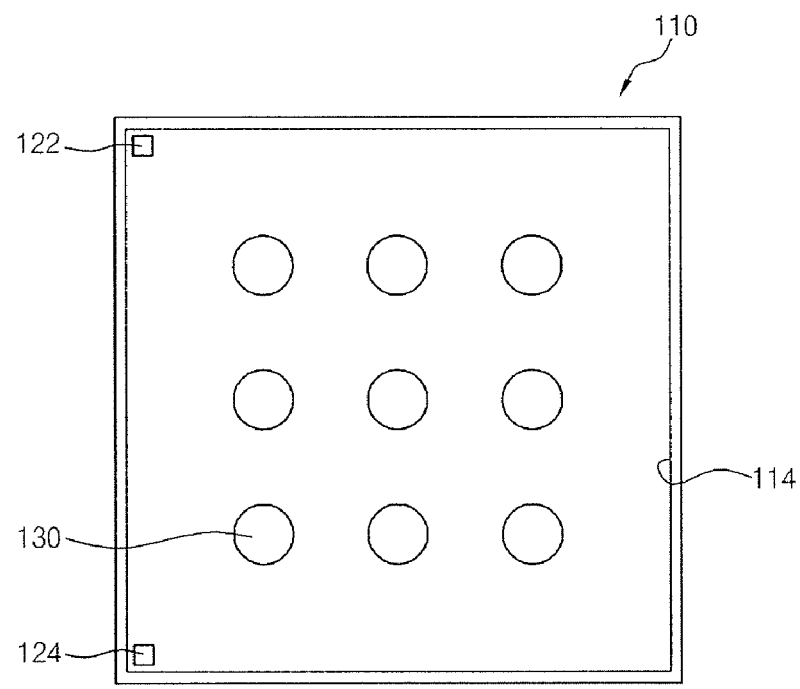
FIG. 4 is a plan view illustrating a semiconductor chip of a stack package in accordance with another embodiment of the present invention.

FIG. 4 is a plan view illustrating a semiconductor chip of a to stack package in accordance with another embodiment of the present invention. The semiconductor chip shown in FIG. 4 is substantially the same as the semiconductor chip described above with reference to FIG. 1, except the number and the disposal of chip selection pads. Therefore, repeated description for the same is component parts will be omitted herein, and the same technical terms and the same reference numerals will be used to refer to the same component parts.

Referring to FIG. 4, a semiconductor chip 110 includes chip selection pads 122 and 124 and through-electrodes 130.

In the embodiment, the chip selection pads 122 and 124 include a first chip selection pad 122 and a second chip selection pad 124 which are respectively disposed adjacent to two adjoining corners. For example, the first chip selection pad 122 is disposed adjacent to the upper left corner in FIG. 4, and the second chip selection pad 124 is disposed adjacent to the lower left corner in FIG. 4, which adjoins the first chip selection pad 122. Unlike this, it can be envisaged that the second chip selection pad 124 can be disposed adjacent to the upper right corner in FIG. 4.

Figure 5:
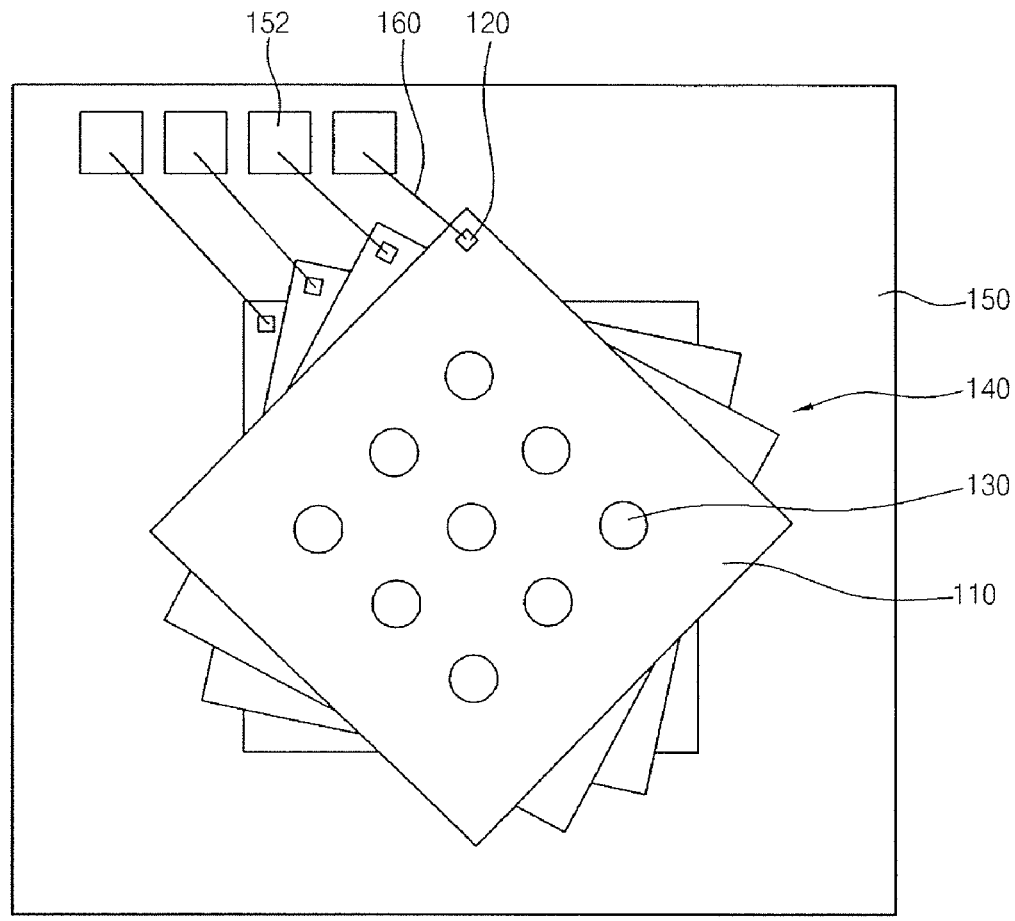
FIGS. 5 and 6 are a plan view and a cross-sectional view illustrating the stack package in accordance with the embodiment of the present invention.
Figure 6:
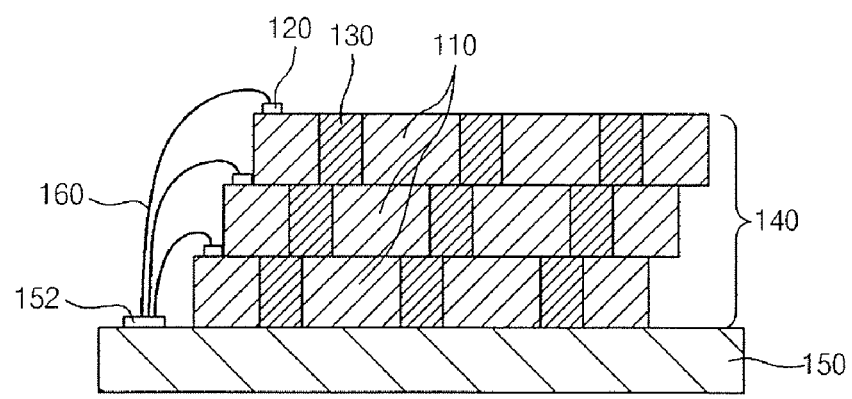

FIGS. 5 and 6 are a plan view and a cross-sectional view illustrating the stack package in accordance with the embodiment of the present invention.

Referring to FIGS. 5 and 6, a stack package 500 includes a semiconductor chip module 140, a substrate 150, and connection members 160.

The semiconductor chip module 140 includes at least two, for example, four, stacked semiconductor chips 110. Each of the stacked semiconductor chips 110 includes a chip selection pad 120 and through-electrodes 130.

The chip selection pad 120 is disposed adjacent to any one of corners on the upper surface of each semiconductor chip 110. The respective semiconductor chips 110 are stacked in such a manner that the chip selection pads 120 are exposed. The through-electrodes 130 which pass through the respective semiconductor chips 110 are electrically connected with one another.

In the embodiment, in order to ensure that the chip selection pads 120 are exposed from the four stacked semiconductor chips 110, the respective semiconductor chips 110 are sequentially rotated by predetermined angles about the rotation centers of the respective semiconductor chips 110. Due to this fact, the stacked semiconductor chips 110 are disposed in such a way as to define the substantial shape of a spiral staircase when viewed from the top.

The semiconductor chip module 140, which has the semiconductor chips 110 disposed in the substantial shape of a spiral staircase and the chip selection pads 120 exposed from the respective semiconductor chips 110, is mounted to the upper surface of the substrate 150.

Connection pads 152 are formed on the upper surface of the substrate 150. In the embodiment, the connection pads 152 are disposed on the upper surface of the substrate 150, for example, in a number corresponding to the number of the chip selection pads 120. In the embodiment, it is preferred that the chip selection pads 120 and the connection pads 152 respectively corresponding to the chip selection pads 120 be separated by the same distance. In the embodiment, the connection pads 152 can be disposed on the substrate 150, for example, in the form of a symmetrical matrix shaped pattern.

The connection members 160 electrically connect the chip selection pads 120 disposed on the respective semiconductor chips 110 and the connection pads 152 of the substrate 150. In the embodiment, the connection members 160 may comprise, for example, bonding wires.

Figure 7:
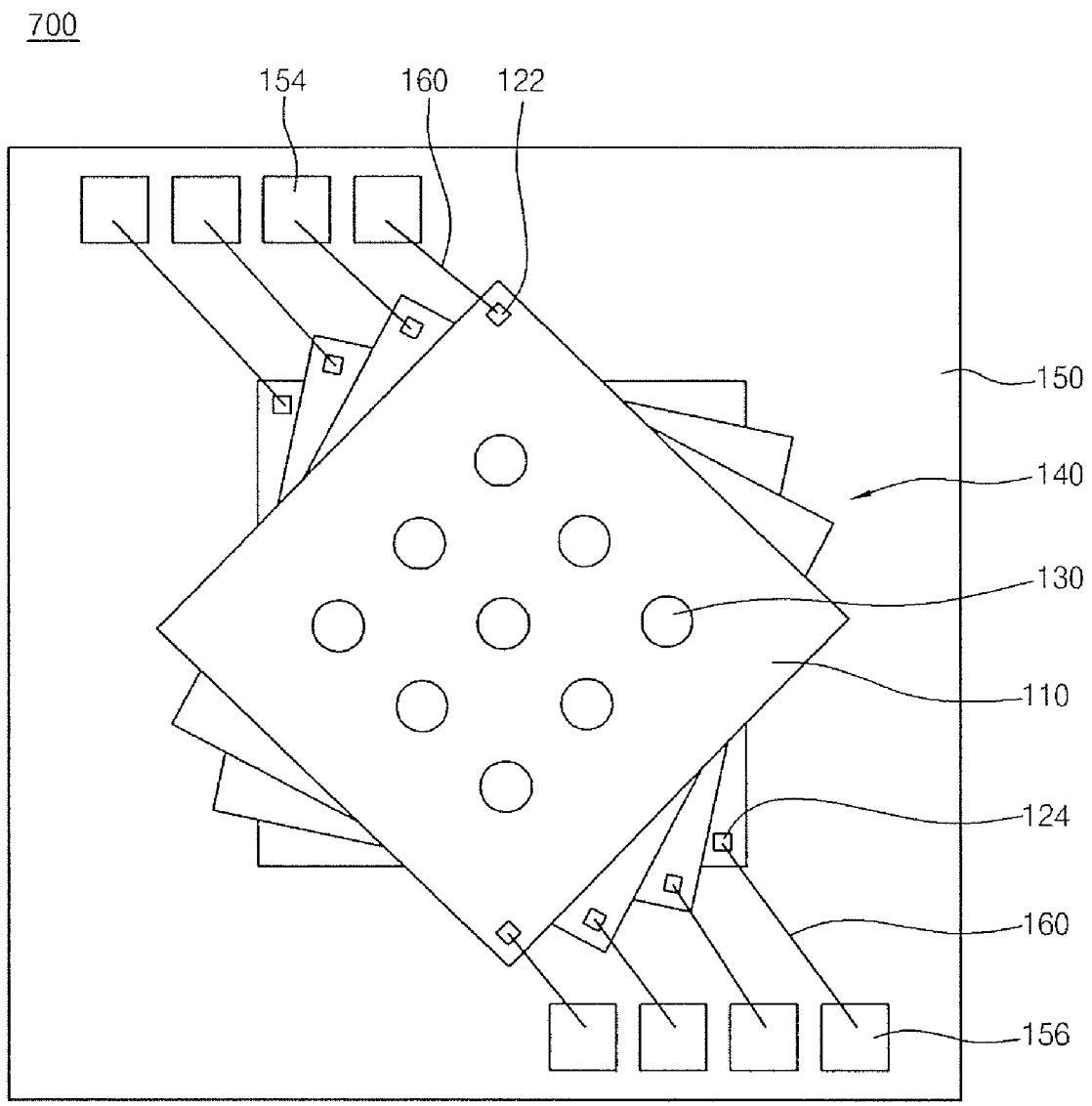
FIG. 7 is a plan view illustrating the stack package in accordance with another embodiment of the present invention.

FIG. 7 is a plan view illustrating the stack package in accordance with another embodiment of the present invention. Repeated description for the same component parts as those shown in FIG. 5 will be omitted herein, and the same technical terms and the same reference numerals will be used to refer to the same component parts.

Referring to FIG. 7, a semiconductor package 700 includes a semiconductor chip module 140, a substrate 150, and connection members 160.

The semiconductor chip module 140 includes at least two, for example, four, stacked semiconductor chips 110. Each of the stacked semiconductor chips 110 includes first and second chip selection pads 122 and 124, and through-electrodes 130.

The first chip selection pad 122 is disposed adjacent to any one of the corners on the upper surface of each semiconductor chip 110, and the second chip selection pad 124 is disposed adjacent to another corner of the corners on the upper surface of each semiconductor chip 110, which is positioned in a diagonal direction with respect to the first chip selection pad 122.

The respective semiconductor chips 110 having the first and second chip selection pads 122 and 124 are stacked in such a manner that the first and second chip selection pads 122 and 124 are exposed. The through-electrodes 130 which pass through the respective semiconductor chips 110 are also electrically connected to one another.

In the embodiment, in order to ensure that the first and second chip selection pads 122 and 124 are exposed from the four stacked semiconductor chips 110, the respective semiconductor chips 110 are sequentially rotated by predetermined angles about the rotation centers of the respective semiconductor chips 110. Due to this fact, the stacked semiconductor chips 110 are disposed in such a way as to define the substantial shape of a spiral staircase when viewed from the top.

The semiconductor chip module 140, which has the semiconductor chips 110 disposed in the substantial shape of a spiral staircase and the first and second chip selection pads 122 and 124 exposed from the respective semiconductor chips 110, is mounted to the upper surface of the substrate 150. First and is second connection pads 154 and 156 are formed on the upper surface of the substrate 150. In the embodiment, the first and second connection pads 154 and 156 are disposed on the upper surface of the substrate 150, for example, adjacent to the first and second chip selection pads 122 and 124.

The connection members 160 electrically connect the first and second chip selection pads 122 and 124 disposed on the respective semiconductor chips 110 and the first and second connection pads 154 and 156 of the substrate 150. In the embodiment, the connection members 160 may comprise, for example, bonding wires.

While it was described above that one or two chip selection pads are formed adjacent to one or two corners of each semiconductor chip 110, unlike this, it can be envisaged that chip selection pads can be formed adjacent to respective corners on the upper surface of each semiconductor chip 110 and through this, an increased number of semiconductor chips 110 can be stacked on the substrate 150.

Figure 8:
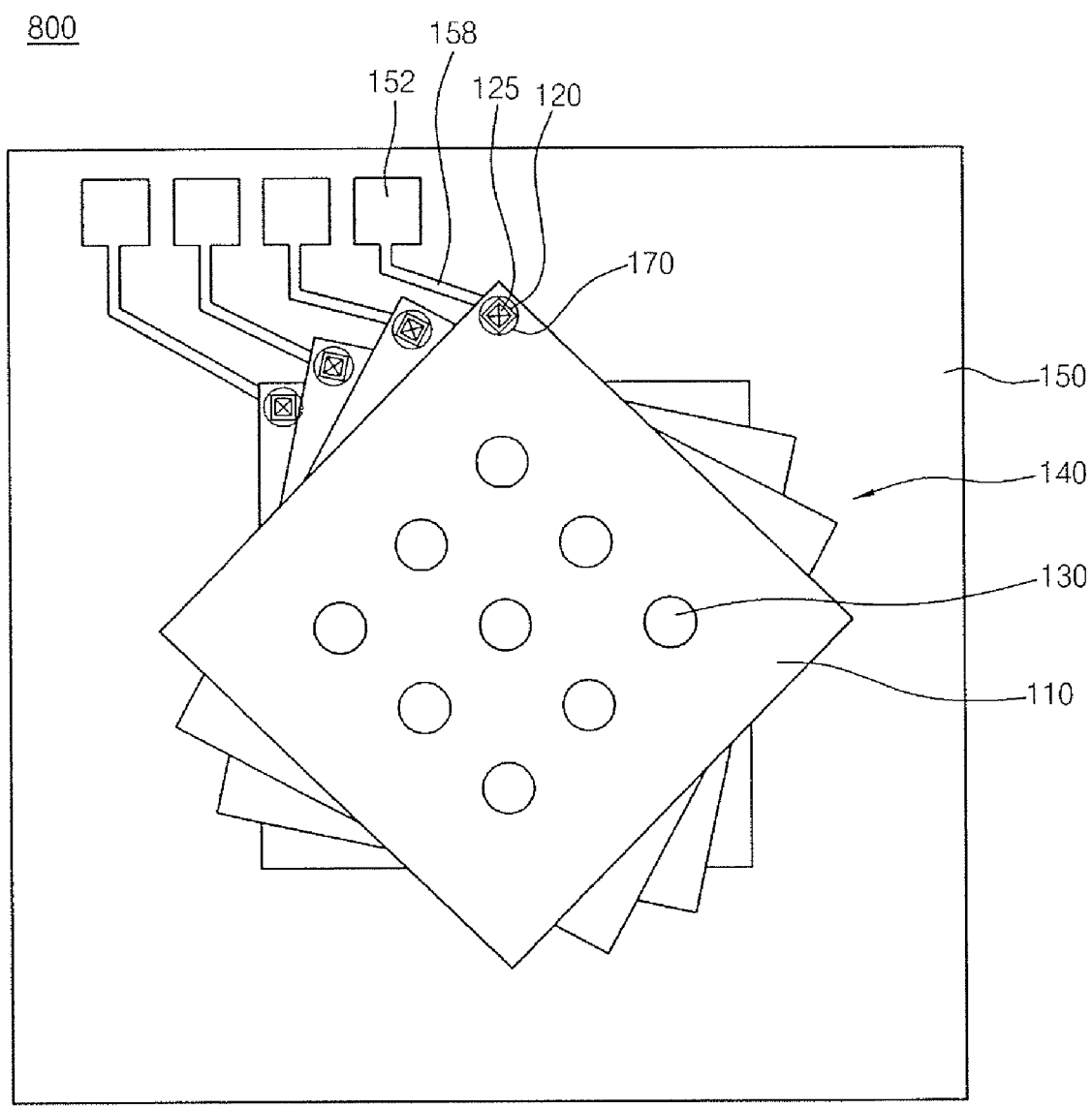
FIG. 8 is a plan view illustrating a stack package in accordance with another embodiment of the present invention.

FIG. 8 is a plan view illustrating a stack package in accordance with another embodiment of the present invention. The stack package shown in FIG. 8 is substantially the same as the stack package described above with reference to FIG. 5, except additional through-electrodes of semiconductor chips, connection pads and connection members. Therefore, repeated description for is the same component parts as those shown in FIG. 5 will be omitted herein, and the same technical terms and the same reference numerals will be used to refer to the same component parts.

Referring to FIG. 8, a stack package 800 includes a semiconductor chip module 140, a substrate 150, and connection members 170.

The semiconductor chip module 140 includes at least two, for example, four, stacked semiconductor chips 110. Each of the stacked semiconductor chips 110 includes a chip selection pad 120, through-electrodes 130, and an additional through-electrode 125.

The chip selection pad 120 is disposed adjacent to any one of corners on the upper surface of each semiconductor chip 110. The respective semiconductor chips 110 are stacked in such a manner that the chip selection pads 120 are exposed. The through-electrodes 130 pass through the respective semiconductor chips 110 and are electrically connected with one another. The additional through-electrode 125 passes through the chip selection pad 120 and a portion of each semiconductor chip 110 which corresponds to the chip selection pad 120.

In the embodiment, in order to ensure that the chip selection pads 120 are exposed from the four stacked semiconductor chips 110, the respective semiconductor chips 110 are sequentially rotated by predetermined angles about the rotation centers of the respective semiconductor chips 110. Due to this fact, the stacked semiconductor chips 110 are disposed in such a way as to define the substantial shape of a spiral staircase when viewed from the top.

The semiconductor chip module 140, which has the semiconductor chips 110 disposed in the substantial shape of a spiral staircase and the chip selection pads 120 exposed from the respective semiconductor chips 110, is mounted to the upper surface of the substrate 150.

Connection pads 152 are formed on the upper surface of the substrate 150. In the embodiment, the connection pads 152 are disposed on the upper surface of the substrate 150, for example, in a number corresponding to the number of the chip selection pads 120.

The respective connection pads 152 have extensions 158 which extend to portions facing the additional through-electrodes 125 of the respective chip selection pads 120.

The connection members 170 are interposed between the additional through-electrodes 125 disposed in respective semiconductor chips 110 and the extensions 158 facing the to additional through-electrodes 125. The additional through-electrodes 125 and the connection pads 152 are electrically connected with each other by the connection members 170. In the embodiment, the connection members 170 may be conductive members having, for example, a spherical shape or a column shape.

While, not shown in a drawing, the additional through-electrodes 125 may be formed to pass through the portion of the semiconductor chips 110 which are away from the chip selection pads 120. This case, the connection members 170 may be a conductive pattern, that is, re-distribution layer formed on the upper surface 111 of the semiconductor chips 110 to connect between the chip selection pad and the additional through-electrode 125.

Hereinafter, a method for manufacturing a stack package in accordance with another embodiment of the present invention will be described with reference to the attached drawings.

First, referring to FIGS. 1 and 2, the semiconductor chip 110 including the chip selection pad 120 and the through-electrodes 130 is manufactured through a semiconductor chip manufacturing process and a through-electrode forming process well known in the art.

The semiconductor chip 110 has the shape of a quadrangular plate. The semiconductor chip 110 has the circuit unit 114 which includes a data storage section (not shown) for to storing data and a data processing section (not shown) for processing data.

The chip selection pad 120 is disposed on the upper surface 111 of the semiconductor chip 110. The chip selection pad 120 is disposed on the upper surface 111 of the semiconductor chip 110 adjacent to any one of the four corners. The chip selection pad 120 is electrically connected with the circuit unit 114.

The through-electrodes 130 pass through the upper surface 111 and the lower surface 112, facing away from the upper surface 111, of the semiconductor chip 110. In the embodiment, the through-electrodes 130 may be formed to have a circular or elliptical cross sectional shape when viewed from above. Unlike this, the through-electrodes 130 may be formed to have a curved sectional shape. Examples of a material which can be used to form the through-electrodes 130 include copper, a copper alloy, and aluminum.

After the semiconductor chip 110 including the chip selection pad 120 and the through-electrodes 130 is manufactured, as shown in FIG. 5, at least two, for example, four, semiconductor chips 110 are stacked in the shape of a spiral staircase in such a manner that chip selection pads 120 are exposed and the through-electrodes 130 are electrically connected with one another. In this way, the semiconductor chip module 140 is prepared.

After the semiconductor chip module 140 is prepared, the semiconductor chip module 140 is mounted onto the substrate 150 which is formed with the connection pads 152.

After the semiconductor chip module 140 is mounted onto the substrate 150, the chip selection pads 120 of the respective semiconductor chips 110 and the connection pads 152 of the substrate 150 are electrically connected with each other by means of the connection members 160 such as conductive wires, by which the stack package 500 is manufactured.

It was illustrated and described in the embodiment that the chip selection pads 120 of the semiconductor chips 110 and the connection pads 152 of the substrate 150 are electrically connected with each other by means of the conductive wires. However, as shown in FIG. 8, it can be contemplated that the additional through-electrodes 125 are formed in the semiconductor chips 110 to pass through the chip selection pads 120, the extensions 156 are formed on the substrate 150 to extend from the connection pads 152 to the positions of the additional through-electrodes 125, and the connection members 160 are interposed between the additional through-electrodes 125 and the extensions 156 such that the chip selection pads 120 of the semiconductor chips 110 and the connection pads 152 of the substrate 150 are electrically connected with each other by means of the additional through-electrodes 125 and the extensions 156.

As is apparent from the above description, the stack package according to the present invention provides advantages in that, in the state in which a plurality of semiconductor chips are stacked, a certain semiconductor chip can be easily selected among the stacked semiconductor chips.

Although specific embodiments of the present invention have been described for illustrative purposes, those skilled in the art will appreciate that various modifications, additions and substitutions are possible, without departing from the scope and the spirit of the invention as disclosed in the accompanying claims.

What is claimed is:

1. A stack package comprising:
   a semiconductor chip module including at least two semiconductor chips which have chip selection pads and through-electrodes and which are stacked together such that the chip selection pads are exposed and the through-electrodes of the stacked semiconductor chips are electrically connected respectively to one another;
   a substrate having the semiconductor chip module mounted thereto and having connection pads; and
   connection members electrically connecting respectively the chip selection pads to the connection pads, wherein the semiconductor chips of the semiconductor chip module are sequentially rotated with respect to each other to form a spiral staircase shape such that the chip selection pads of the respective stacked semiconductor chips are exposed.

2. The stack package according to claim 1, wherein when each semiconductor chip has a quadrangular plate shape then one chip selection pad of each respective semiconductor chip is disposed adjacent to any one corner of each respective semiconductor chip.

3. The stack package according to claim 1, wherein when each semiconductor chip has a quadrangular plate shape then two chip selection pads of each respective semiconductor chip are separately disposed adjacent to two corresponding corners of each respective semiconductor chip in which the two corresponding corners are opposite with respect to each other along a diagonal direction of the quadrangular plate shape.

4. The stack package according to claim 1, wherein when each semiconductor chip has a quadrangular plate shape then the two chip selection pads of each respective semiconductor chip are separately disposed adjacent to two adjoining corners of four corners of each semiconductor chip.

5. The stack package according to claim 1, wherein the through-electrodes form a symmetrical matrix shaped pattern on each semiconductor chip.

6. The stack package according to claim 1, wherein the through-electrodes have a sectional area gradually decreasing from one ends thereof, on which the chip selection pads are formed, to the other ends thereof, which face away from the one ends.

7. The stack package according to claim 1, wherein the chip selection pads have a smaller cross sectional area than that of the through-electrodes.

8. The stack package according to claim 1, wherein distances between respectively connected together chip selection pads and connection pads are substantially equal.

9. The stack package according to claim 1, wherein the connection members comprise bonding wires.

10. The stack package according to claim 1, further comprising:
   additional through-electrodes passing through the semiconductor chips; and
   extensions extending from the connection pads corresponding to the additional through-electrodes so that the additional-through electrodes and the connection pads can be electrically connected with each other by the connection members.

11. The stack package according to claim 10, wherein the additional through-electrodes which are electrically connected with the connection pads by the connection members are formed to pass through the respective chip selection pads.

12. The stack package according to claim 11, wherein the connection members comprise conductive members which have a spherical shape or a column shape.

13. The stack package according to claim 10, wherein the additional through-electrodes which are electrically connected with the connection pads by the connection members is formed at a portion of the semiconductor chips which are away from the chip selection pads.

14. The stack package according to claim 13, wherein the connection members comprise a distribution-layer formed on the semiconductor chips.

* * * * *